United States Patent
Chan Wai Po et al.

(10) Patent No.: US 8,140,033 B2
(45) Date of Patent: Mar. 20, 2012

(54) METHOD FOR AUTOMATIC IMPEDANCE MATCHING FOR A RADIOFREQUENCY CIRCUIT AND TRANSMISSION OR RECEPTION SYSTEM WITH AUTOMATIC MATCHING

(75) Inventors: Francis Chan Wai Po, Grenoble (FR); Emeric De Foucauld, Seyssinet (FR); Pierre Vincent, Villard de Lans (FR)

(73) Assignee: Commissariat a l'Energie Atomique, Paris (FR)

( * ) Notice: Subject to any disclaimer, the term of this patent is extended or adjusted under 35 U.S.C. 154(b) by 603 days.

(21) Appl. No.: 12/207,724

(22) Filed: Sep. 10, 2008

(65) Prior Publication Data

US 2009/0066440 A1 Mar. 12, 2009

(30) Foreign Application Priority Data

Sep. 11, 2007 (FR) ...................... 07 06360

(51) Int. Cl.
*H04B 17/00* (2006.01)
(52) U.S. Cl. ................. 455/115.1; 455/67.11; 455/127.2
(58) Field of Classification Search .................. 455/107, 455/121, 129, 269, 197.2, 197.3, 192.1, 192.3, 455/114.1, 114.2, 114.3, 123, 125, 136, 137, 455/138, 139, 164.1, 194.2, 198.1, 220, 262, 455/263, 320, 77, 87, 120, 193.1, 195.1, 455/67.11, 115.1, 127.2
See application file for complete search history.

(56) References Cited

U.S. PATENT DOCUMENTS

| | | | |
|---|---|---|---|
| 4,375,051 A * | 2/1983 | Theall .......................... 333/17.3 |
| 4,835,608 A * | 5/1989 | Lachiw et al. ................ 348/733 |
| 6,259,334 B1 | 7/2001 | Howard | |
| RE40,620 E * | 1/2009 | Elder et al. ..................... 455/121 |
| 7,821,273 B2 * | 10/2010 | Van Bezooijen et al. ..... 324/646 |
| 7,831,219 B2 * | 11/2010 | Heuermann et al. .......... 455/107 |
| 2007/0035356 A1 | 2/2007 | Ranta | |
| 2007/0135062 A1* | 6/2007 | Hwang et al. ................... 455/80 |
| 2007/0155347 A1* | 7/2007 | Heuermann et al. .......... 455/107 |

FOREIGN PATENT DOCUMENTS

| | | |
|---|---|---|
| DE | 1221348 | 7/1966 |
| DE | 1915760 A1 | 11/1969 |
| DE | 1766154 B1 | 2/1971 |
| FR | 2573940 A1 | 5/1986 |
| FR | 2715869 A | 8/1995 |

OTHER PUBLICATIONS

European Official Letter dated Sep. 22, 2011 for Application 08164092.2.

\* cited by examiner

*Primary Examiner* — Nay A Maung
*Assistant Examiner* — Cindy Trandai
(74) *Attorney, Agent, or Firm* — Lowe Hauptman Ham & Berner, LLP

(57) ABSTRACT

The invention relates to a method for automatically matching the antenna impedance for a radiofrequency transmission circuit having an amplifier. An impedance matching network is inserted between the amplifier and the antenna. The output current i and voltage V from the amplifier and their phase shift are measured, and from this the complex impedance, defined by V/i, is deduced. The antenna impedance is calculated as a function of this complex impedance and as a function of the known present values of the adjustable impedances of the matching network. New values are calculated, from the calculated value of the antenna impedance, for the adjustable impedances of the matching network that allow an overall load impedance of the amplifier to be obtained which is as close as possible to the nominal load impedance $Z_{opt}$ of the amplifier, and the matching network is controlled to adjust the adjustable impedances to these new values.

19 Claims, 2 Drawing Sheets

METHOD FOR AUTOMATIC IMPEDANCE MATCHING FOR A RADIOFREQUENCY CIRCUIT AND TRANSMISSION OR RECEPTION SYSTEM WITH AUTOMATIC MATCHING

RELATED APPLICATIONS

The present application is based on French, and claims priority from, French Application Number 07 06360, filed Sep. 11, 2007, the disclosure of which is hereby incorporated by reference herein in its entirety.

FIELD OF THE INVENTION

The invention relates to the production of an automatic impedance matching circuit for a radio antenna.

BACKGROUND OF THE INVENTION

In some radiofrequency information transmission applications it has been observed that the transmit or receive antenna might have an impedance depending strongly on conditions external to the antenna, and depending notably on the environment in which the antenna is placed.

For example, in medical telemetry it is possible for an antenna in a probe to be placed inside the human body, and the impedance then depends strongly on the biological environment in which the antenna finds itself. It depends on the electrical properties (conductivity, dielectric constant) of the surrounding tissues (muscles, fat) or on the liquid environment (blood, other fluids) in which the antenna may be immersed.

Even in more conventional radiofrequency transmission applications (mobile telephony, etc.) the impedance of the antenna can vary.

A transmission system (or reception system respectively) comprises at least one amplifier with which one or more filters may be associated.

Generally speaking, the variations in antenna impedance are particularly sensitive for very small-sized antennas having a high quality factor, used in applications with strong miniaturization constraints.

These variations in impedance may lead to losses called mismatch losses: these losses result from the fact that the transmission system that supplies the antenna, or the reception system that receives a signal from the antenna, is generally designed for optimal performance when it is loaded (at output for the transmission system or at input for the reception system) with a well determined nominal impedance. Its performance deteriorates when it is loaded with an impedance different from its nominal value. The mismatch losses can be up to 40 dB.

This is why attempts have already been made to put an impedance matching network between the output of the transmission system and the transmit antenna (and this can also be done at the input for a receive antenna), which has the effect that the transmission system sees a different impedance from that of the antenna and which is preferably equal to the nominal value for which it was designed, for example 100 ohms or 500 ohms. The matching network is tuneable, i.e. its capacitive and/or inductive elements have adjustable values in order to take account of the conditions in the environment of the antenna so that the matching is the best possible, whatever the circumstances.

In the prior art illustrated by patent U.S. Pat. No. 4,375,051 it has been proposed to use a bidirectional coupler to detect a mismatch: the amplifier power is applied to a load by means of the coupler and of an impedance matching network. If the assembly is mismatched, a part of the power sent to the antenna is reflected by it instead of being sent into the surrounding environment. The reflected part passes back into the coupler and exits it through a specific output. The reflected output power is detected, measured and serves to servo-control the impedance network in order to change its constitution in a direction tending to reduce the reflected power. The matching network comprises variable capacitors.

This method suffers from two drawbacks. On the one hand, the reflected power may be low and subject to parasitic interference as all interference picked up by the antenna distorts the measurement due to the fact that it is added to the reflected power while it does not constitute power reflected by the mismatch. On the other hand, there is no one-to-one relationship between the quantity of reflected power (which serves as input to the servo-control) and the complex impedance value which it has to provide to the matching network in order to truly match the amplifier to the antenna. This method therefore leads to an new impedance which is not necessarily optimal, as several complex impedance pairs correspond to a given power. This is because detecting the mismatch through the power measurement (scalar method) causes a loss of information about the phase shift between the currents and voltages. The known method therefore employs a slow servo-control system, functioning by successive iterations and trial and error, without simply converging on a stable match position. Finally, the bidirectional couplers it uses are bulky. These systems are not well suited for applications where the matching speed and size are important criteria. According to the invention, simultaneous detection of the amplitude and the phase of the current and of the voltage at the output of the transmission system (or at the input of the reception system) is proposed. The mismatch detection is therefore vectorial and the ratio of the voltage to the current is truly representative of the impedance Z seen by the system loaded by the assembly of the matching network and of the antenna of impedance $Z_{ant}$, on condition that the voltages and currents are considered in vector form, i.e. by taking account of the phase shift between current and voltage. The load impedance seen by the amplifier is a function of the antenna impedance $Z_{ant}$ and the various impedances of the matching network; the antenna impedance $Z_{ant}$ is then calculated from the measured load impedance $Z_m$ and impedances of the matching network, the configuration of which is known at the moment of measurement, and finally the modification that needs to be applied to one or more of the impedances of the matching network is calculated in order that the impedance seen by the amplifier becomes matched to the nominal impedance of the amplifier in the current conditions of the environment of the antenna.

The invention therefore enables direct calculation of the optimum impedance matching network in a mathematical, hence certain and quick, manner.

SUMMARY OF THE INVENTION

Thus the invention more specifically proposes an automatic impedance matching method for a radiofrequency transmission system comprising at least an amplifier, an antenna, and an impedance matching network between the amplifier and the antenna, this network comprising several impedances, some of which have adjustable numerical values, the transmission system having a nominal load impedance for which it has the desired performance, this method being characterized in that it comprises the following steps:

measurement of the output current and voltage from the amplifier;

calculation of the complex impedance defined by the ratio between this voltage and this current, taking account of their phase shift, this impedance representing a present load impedance of the amplifier;

calculation of the antenna impedance as a function of this present load impedance and as a function of the known present values of the adjustable impedances of the matching network;

calculation, from the calculated value of the antenna impedance, of new values for the adjustable impedances of the matching network that allow an overall load impedance of the amplifier to be obtained which is as close as possible to the nominal load impedance; and control of the matching network to adjust the adjustable impedances to these new values.

Symmetrically, for a radiofrequency reception circuit, the invention also proposes an automatic impedance matching method for a radiofrequency reception system comprising at least an amplifier, an antenna, and an impedance matching network between the amplifier and the antenna, this network comprising several impedances, some of which have adjustable numerical values, the reception system having the desired performance when a nominal input impedance is connected at its input, this method being characterized in that it comprises the following steps:

measurement of the input current and voltage from the amplifier;

calculation of the complex impedance defined by the ratio between this voltage and this current, taking account of their phase shift, this impedance representing an input impedance presently connected to the amplifier;

calculation of the antenna impedance as a function of this present input impedance and as a function of the known present values of the adjustable impedances of the matching network;

calculation, from the calculated value of the antenna impedance, of new values for the adjustable impedances of the matching network that allow an overall input impedance of the amplifier to be obtained which is as close as possible to the nominal input impedance; and control of the matching network to adjust the adjustable impedances to these new values.

For a radiofrequency circuit simultaneously operating as a transmitter and as a receiver with a single transmit/receive antenna, and therefore having a transmit amplifier and a receive amplifier, it is possible to provide two distinct matching networks, one for matching the output load of the transmitter amplifier, the other for matching the input load of the receive amplifier.

A measurement impedance of a known complex value is preferably inserted in series between the amplifier and the matching network; it enables determination of the current which will serve to calculate the complex impedance. This measurement impedance may be a simple capacitor.

The method preferably includes the working out of an electrical control voltage, depending on the result of the calculation of a new adjustable impedance value for the matching network, and the application of this voltage to a variable capacitor which is controllable by an electrical voltage and forms part of the matching network.

The method may also include the generation of switching control signals from the result of the calculation of a new value of the adjustable impedance and the application of these signals to a network of switchable elementary capacitors forming part of the matching network.

The invention also relates to a radiofrequency transmission or reception system comprising at least an amplifier, an antenna, and an impedance matching network between the amplifier and the antenna, this network comprising several impedances, some of which have adjustable numerical values, characterized in that it comprises:

a measurement impedance of known complex value inserted in series between the amplifier and the matching network;

means for measuring a first voltage, which is the voltage at the terminals of the measurement impedance, and a second voltage, which is the output voltage of the amplifier (for a transmission system) or the input voltage of the amplifier (for a reception system);

means for calculating the complex impedance defined by the ratio between the second voltage and the first voltage, taking account of the phase shift between these voltages, this complex impedance representing a present load or input impedance for the amplifier;

means for calculating the antenna impedance as a function of this present load or input impedance and as a function of the known present values of the adjustable impedances of the matching network;

means for calculating, from the calculated value of the antenna impedance, new values for the adjustable impedances of the matching network that allow an overall load or input impedance of the amplifier to be obtained which is as close as possible to the nominal load or input impedance; and means for electrically controlling the matching network to adjust the adjustable impedances to these new values.

The matching network may consist of a simple T or Pi assembly of three reactive impedances, for example one capacitor and two inductors, or better one inductor and two capacitors. At least one of these impedances is variable, but in practice two of the impedances will be variable. Preferably, two variable capacitors and a fixed inductor will be used, bearing in mind that it is easier to produce accurate variable capacitors than variable inductors. The matching network may also have several cascaded stages if there is a risk of the mismatch being particularly large. In this case each stage may consist of a simple T or n assembly of three reactive impedances, in principle with two variable reactive impedances in each stage.

The variable impedances may be produced in the form of several elementary impedances in series and/or in parallel, individually switchable by an electronic control. A variable capacitor may also be produced by an element controllable by an electrical voltage.

The aim of the invention is to ideally obtain a global load or input impedance of the amplifier equal to the nominal load or input impedance of the amplifier; however, the precision of adjustment of the adjustable elements of the matching network is not infinite and the practical aim will be to get an impedance as close as possible to the nominal impedance.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF DRAWINGS

The present invention is illustrated by way of example, and not by limitation, in the figures of the accompanying drawings, wherein elements having the same reference numeral designations represent like elements throughout and wherein.

DESCRIPTION OF PREFERRED EMBODIMENTS

In the following detailed description the antenna will systematically be considered to be a transmit antenna supplied by the output from an amplifier which is designed to operate optimally when the load located at its output has a nominal impedance $Z_{opt}$ and when the operating frequency is f, corresponding to an angular frequency $\omega=2\pi f$. At high frequencies, the impedance $Z_{opt}$ will generally be complex. But the invention is applicable in the same way if the antenna is a receive antenna connected to the input of an amplifier designed to operate optimally when the impedance connected to its input is a nominal impedance $Z_{opt}$ and when the operating frequency is f. If the antenna must simultaneously operate as a transmitter and as a receiver, the transmit amplifier will preferably have a nominal load impedance equal to the nominal input impedance of the receive amplifier. If this is not the case, the transmit amplifier and the receive amplifier will be associated with two distinct matching networks, one matching the output load of the transmit amplifier, the other matching the input load of the receive amplifier. As the method is the same for transmission and reception and as the calculations are also the same, the invention will be described solely with reference to the transmit amplifier and transmit antenna.

Figure 1:
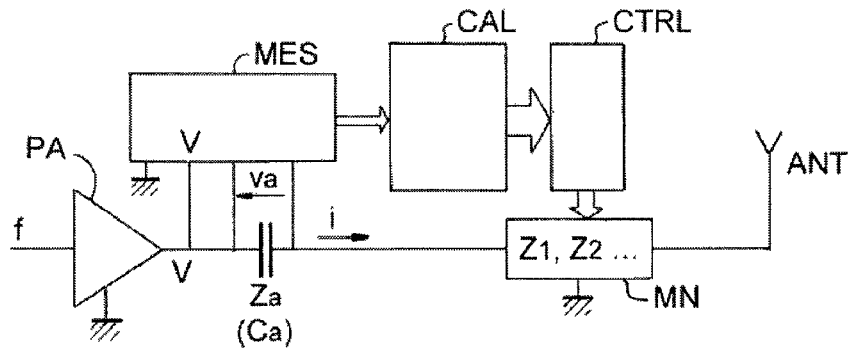
FIG. 1 shows the general constitution of a radiofrequency transmission circuit comprising automatic impedance matching means.

FIG. 1 shows the schematic diagram of the radiofrequency transmission circuit according to the invention, with an amplifier PA operating at the carrier transmission frequency f, an antenna ANT supplied by the amplifier, a matching network MN inserted in series between the output of the amplifier PA and the antenna ANT. This scheme may also include a filter between the amplifier PA and the network MN and/or a filter between the network MN and the antenna.

According to the invention, an impedance $Z_a$ has been added, in series between the output of the amplifier and the matching network MN, serving to measure the current i that leaves the amplifier. The impedance $Z_a$ is preferably a simple capacitor $C_a$ of impedance $Z_a=1/j\omega C_a$. The voltage at its terminals is a voltage $v_a$ equal to $iZ_a$, or $v_a=i/j\omega C_a$. Such a capacitor may be used whatever the frequency range and whatever the dimension of the circuitry. Using such a capacitor is also a solution which is less expensive than devices based on the use of a transformer.

The output voltage of the amplifier, which supplies the network MN and the antenna ANT, is a voltage V.

The impedance seen by the amplifier output is therefore an impedance Z equal to V/i. If the amplitude and phase of V and i is measured, it is possible to determine a present measured value, $Z_m$, of the impedance Z seen by the amplifier. The value $Z_m$ is a complex value, with a real part and an imaginary part, from the moment the phase shift between the current i and the voltage V is taken into account. The current i is determined from the measurement of $v_a$, where $Z_a$ is known.

The circuit of FIG. 1 therefore also includes:
- a measurement circuit MES for measuring the voltage $v_a$ and the voltage V;
- a calculation circuit CAL in order to determine the modulus and argument and/or the real part and imaginary part of a measured impedance value $Z_m$ from measurements of V and $v_a$, and in order then to determine the impedance values that need to be used in the matching network MN, as a function of the result of the measurement $Z_m$ of the load impedance Z, so as to bring the load impedance Z closer to its nominal value $Z_{opt}$; and
- a control circuit CTRL for controlling the matching network MN, which receives the results of the calculation made by the circuit CAL in order consequently to modify the network MN.

Figure 4:
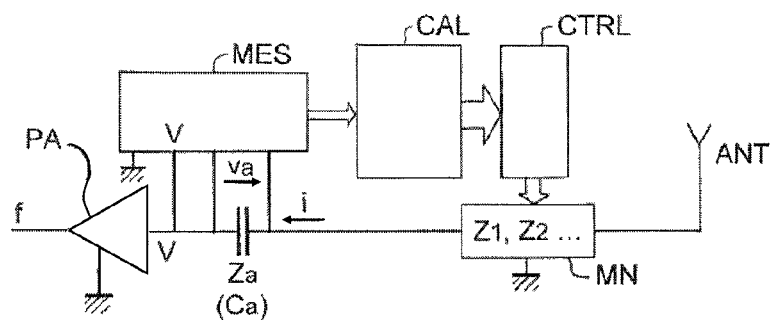
FIG. 4 shows the general constitution of a radiofrequency reception circuit.

The measurement circuit MES essentially consists of a conventional frequency changing circuit and an analogue-digital converter. This is because the voltages V and $v_a$ are electrical signals at the carrier frequency f. To reduce electrical consumption and improve calculation accuracy, it may be advantageous to carry out the impedance calculation at low frequency. A transformation to a lower frequency is therefore provided to be able to do the calculations that follow. It should be noted that in some cases it is possible for this measurement circuit to consist of circuit elements present in the radiofrequency reception circuits of the system. As illustrated in FIG. 4, an amplifier PA is oriented in the direction for adaptation of an antenna ANT to the input of the amplifier PA rather than the output of the amplifier PA. Thus, the direction of voltage Va and current i in FIG. 4 are reversed to those in FIG. 1. This is because, if the system operates as a transmitter and as a receiver, the reception part includes frequency-changing circuits and these circuits may very well serve to carry out the measurement of V and $v_a$. In this case, the impedance measurement is made in a signal transmission phase by the amplifier PA, as the reception circuits are available at this moment.

The calculation circuit CAL is a dedicated digital processor or a programmed microprocessor.

Figure 2:
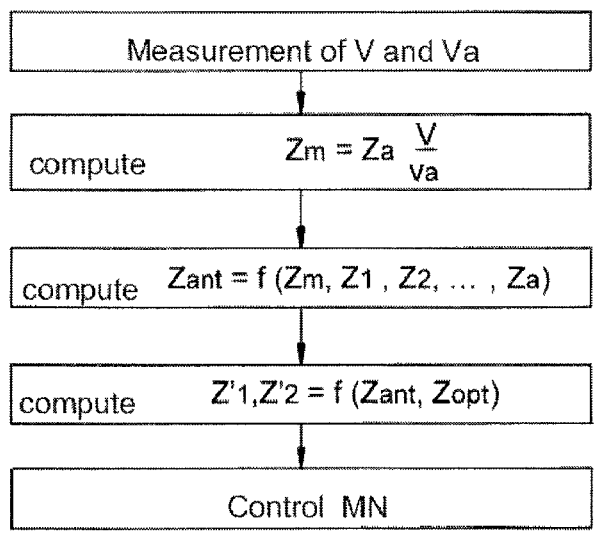
FIG. 2 shows a schematic diagram of the main steps of the method according to the present invention.

The method according to the invention is summarized in the flow chart of FIG. 2 and consists, using these circuits, in calculating the modulus and the argument of the impedance $Z_m$ of the present amplifier load, calculating from this the vector impedance $Z_m$ with a real part and an imaginary part, calculating the antenna impedance $Z_{ant}$ from these values and from the known present impedance values of the various impedances $Z_1$, $Z_2$, etc. that constitute the matching network MN, calculating one or more modified impedance values $Z'_1$, $Z'_2$ for the matching network MN from a desired value $Z_{opt}$ of the load impedance of the amplifier and from the calculated antenna impedance $Z_{ant}$, and controlling the network MN to give the impedances $Z_1$, $Z_2$ of this network the modified values $Z'_1$, $Z'_2$ thus calculated.

Consequently, a servo-control tending to minimize the power reflected by the mismatched load impedance, as in the prior art, is no longer produced; rather the theoretical values of the matching network impedances which optimize the load impedance in the present conditions are calculated and applied to this network.

Figure 3:
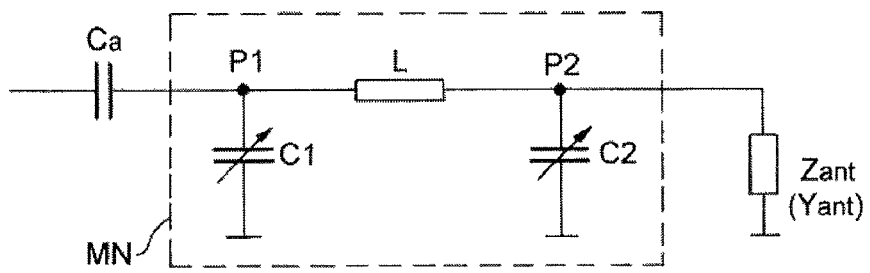
FIG. 3 shows an example of a simple Pi impedance matching network with two variable capacitors.

The calculation depends, of course, on the configuration of the matching network MN and an example will be provided below for a matching network in a Pi configuration with three impedances $Z_1$, $Z_2$, $Z_3$ that consist of two variable capacitors $C_1$ and $C_2$ in parallel, separated by an inductor L in series. This network is shown in FIG. 3. The current measurement impedance $Z_a$ is, in this example, a capacitor $C_a$ located in series between the output of the amplifier PA and the matching network.

The present values of the capacitors of the matching network will be called $C_1$ and $C_2$, and the new values of these capacitors, calculated according to the invention in order to optimize the amplifier load impedance by making it as close as possible to the optimal value $Z_{opt}$, will be called $C_1'$ and $C_2'$.

First Step: Calculation of the Present Load Impedance

The measurement circuit MES receives the previously defined voltage signals V and $v_a$. These voltages are at the carrier frequency f. They are preferably reduced to a frequency that is intermediate or in the baseband by conventional frequency-changing circuits using a local oscillator and mixers. The voltage levels V and $v_a$, reduced to this intermediate or baseband frequency, are then used to calculate the vector current i, then the complex impedance V/i seen by the amplifier (or to calculate directly this impedance V/i without determining i). The phases shifts are preserved in the frequency change.

The modulus of i is the relationship between the modulus of $v_a$ and the modulus of the impedance $Z_a = 1/j\omega C_a$; or alternatively the modulus of the impedance Z is the modulus of the product $VZ_a/v_a$, i.e. of the product $V/j\omega C_a v_a$. The phase shift of i relative to the voltage V is an angle $\theta$ which represents the argument of the impedance Z. This angle can be determined from the phase shift between V and $v_a$, from which $\pi/2$ is subtracted, knowing that the phase shift between i and $v_a$ is $\pi/2$ since $Z_a$ is a capacitor.

The phase shift between V and $v_a$ can be calculated, for example, by multiplying the analogue signals V and $v_a$, reduced to the baseband, and by observing the periodic variation in the product of these two signals. This product oscillates between a maximum positive value and a minimum negative value. The algebraic sum of these two values is proportional to the cosine of the phase shift and the proportionality coefficient is the algebraic difference between these two values. Consequently, from the ratio of the sum of the two values to the difference between the two values, the cosine of the phase shift is found, from which the phase shift between V and $v_a$ is drawn, from which the phase shift between V and i is deduced. Other methods for numerical calculation of the phase shift may be used, for example by digitizing the two signals V and $v_a$ over one bit, equal to 1 when the signal is positive and to 0 when it is negative. The time delay between 1-bit pulse trains resulting from the digitization of V, relative to the same pulse trains corresponding to the digitization of $v_a$, represents the phase shift between V and $v_a$. The sign of the phase shift is spotted by observing the leading pulse edges of the signals thus digitized over one bit. This can be done by a latch D that receives one of the voltages V or $v_a$ at a signal input and the other of these voltages at a clock input, and which reports at its output the state of the signal input at the moment of a leading pulse edge at the clock input.

Once the argument $\theta$ of the impedance Z has been obtained, it is possible to calculate the real part and the imaginary part of Z. The impedance thus measured for Z will be called $Z_m$; $Z_{mr}$ is its real part, $Z_{mi}$ is its imaginary part. $Z_{mr}$ is equal to the modulus of Z multiplied by $\cos\theta$. $Z_{mi}$ is equal to the modulus of Z multiplied by $\sin\theta$.

Second Step: Calculation of the Current Antenna impedance

From this measurement of Z, knowing the configuration of the matching network to be that of FIG. 3, with the known current numerical values of the capacitors $C_1$ and $C_2$ and of the inductor L, and also the numerical value of the capacitor $C_a$, it is possible to calculate the antenna impedance. The known values of $C_1$, $C_2$ result either from initial values of the capacitors or from a previous matching. The values of L and $C_a$ are also common and are fixed.

Not all the details of the calculation will be explained, but only the main steps:

If the antenna impedance $Z_{ant}$ is written in the form $Z_{ant} = (A+jB)/(C+jD)$ it is possible to show that in the circuit of FIG. 3:

$$A = 1 - \omega^2 LC_1 - \omega^2 LC_a - Z_{mi}\omega^3 LC_1 C_a + Z_{mi}\omega C_a$$

$$B = \omega^3 Z_{mr} LC_1 C_a - Z_{mr}\omega C_3$$

$$C = Z_{mr}\omega^4 LC_1 C_2 C_a - Z_{mr}\omega^2 C_1 C_a - Z_{mr}\omega^4 C_2 C_a$$

$$D = Z_{mi}(\omega^4 LC_1 C_2 C_a - \omega^2 C_1 C_a - \omega^2 C_2 C_a) + \omega^3 L(C_1 C_2 + C_2 C_a) - \omega C_1 - \omega C_2 - \omega C_a.$$

From this the modulus and the argument of the current antenna impedance $Z_{ant}$ is deduced:

the modulus of $Z_{ant}$ is the square root of $(A^2+B^2)/(C^2+D^2)$;

and the argument of $Z_{ant}$ is the difference between the arctangent of B/A and the arctangent of D/C.

The real part of $Z_{ant}$ is $Z_{antR}$, equal to the modulus multiplied by the sine of this argument; the imaginary part of $Z_{ant}$ is $Z_{antim}$ and is the modulus multiplied by the cosine of this same argument.

It is also possible to calculate the admittance $Y_{ant}$ of the antenna in the same way, in a real part $Y_{antR}$ and an imaginary part $Y_{antim}$. $Z_{ant}$ and $Y_{ant}$ can be determined entirely according to the calculation of $Z_m$.

Third Step: Calculation of Modified Values for the network MN

Simultaneously knowing the current antenna impedance and all the impedances of the matching network ($C_1$, $C_2$, L) and the capacitor $C_a$, it is now possible to calculate the values $C_1'$, $C_2'$ that need to be given to the capacitors $C_1$ and $C_2$ so that the impedance of the assembly, as it will be seen at the terminals of the amplifier is equal to the nominal value $Z_{opt}$ and no longer to the previously determined value $Z_m$. A perfect equality being not possible, one will try to approach it as close as possible, taking into account the fact that the precision of adjustment of the capacitors of the matching network is limited.

The method is inspired by the principles used to calculate impedances by Smith charts: it is investigated which values of capacitive or inductive impedance, shunted or in series, move the load impedance on the chart through to lead it to the centre of the chart, the centre representing a nominal impedance. As the graduations of these charts are normalized, with a unit nominal impedance at the centre of the chart, it is not the real values of the capacitor or of the inductors that are considered each time, but their normalized value, i.e. divided by $Z_{opt}$.

To simplify the writing of the calculations, and by analogy with the use of Smith charts, the values $C_1$, $C_2$, $C_a$, L, $Z_{ant}$ will be considered to be normalized. In practice it is of course necessary to start by dividing all the values by Z then do the following calculations to find the new values for $C_1$ and $C_2$, and the values thus found would be multiplied by $Z_{opt}$ to determine the real values that must be given to the capacitors.

The calculation from the normalized values takes place in several phases.

Phase 1: starting with the antenna impedance $Z_{ant}$ and assuming there to be a capacitor $C_2'$ in parallel upstream of the antenna, it is deduced from this that the admittance Y(P2)

seen at the output of the inductor L (point P2 in FIG. 3) has a real part $Y_r(P2)$ equal to the real part of the antenna admittance.

$$Y_r(P2)=Y_{antR}$$

and it has an imaginary part $Y_{im}(P2)$ at the point P2 which is the sum of the imaginary part of the antenna admittance and of the admittance of the capacitor $C'_2$.

$$Y_{im}(P2)=Y_{antim}+j\omega C'_2$$

$$Y(P2)=Y_{antR}+j(Y_{antim}+j\omega C'_2).$$

The admittance of $C'_2$ is not known as it is sought.

But it is known that the impedance $Z(P1)$ seen from the point P1 upstream of the network MN and downstream of the capacitor $C_3$ has a real part $Z_r(P1)$ equal to 1 (that is the normalized nominal value desired and the capacitor $C_3$ in series does not change this value)

$$Z_r(P1)=1.$$

It is also known that the impedance $Z(P1)$ seen from the point P1 has an imaginary part $Z_{im}(P1)$ which is the difference between a first value, which is the value (in principle 0) of the imaginary part of the impedance of the normalized total load desired for the amplifier, and a second value which is the series impedance of the capacitor $C_a$, that is $1/j\omega C_a$:

$$Z_{im}(P1)=-1/j\omega C_a$$

The real part and the imaginary part of the impedance $Z(P1)$ desired at the point P1 are therefore perfectly determinable from $C_a$.

Now knowing the desired impedance seen in the downstream direction from P1, the desired admittance seen in the downstream direction from P1 is deduced from this, namely the inverse of the impedance.

The desired admittance seen from P1 is $Y(P1)$, with a real part $Y_r(P1)$ and an imaginary part $Y_{im}(P1)$ which are also completely calculable.

Finally, it is known that by placing the capacitor $C'_1$ in parallel at the point P1, the admittance seen in the downstream direction (towards the antenna) from the point P1 will be the sum of the admittance of the capacitor $C'_1$ and of the admittance YS of a series assembly of the inductor L and of the admittance $Y(P2)$ mentioned above.

The series assembly has an impedance ZS which is the sum of the impedance $j\omega L$ of the inductor and of the inverse of the admittance $Y(P2)$.

$$ZS=j\omega L+1/Y(P2)$$

Let $ZS=j\omega L+1/[Y_{antR}+j(Y_{antim}+j\omega C'_2)]$.

The admittance YS of this same assembly is the inverse of the impedance, hence $$YS=1/ZS=1/\{j\omega L+1/[Y_{antr}+j(Y_{antim}+j\omega C'_2)]\}.$$

The admittance seen from the point P1 is the sum of the admittance YS and of the admittance of the capacitor $C'_1$ (the value of which is unknown).

$$Y(P1)=YS+j\omega C'_1.$$

Recall that $Y(P1)$ is known through the calculations indicated above with its real part $Y_r(P1)$ and its imaginary part $Y_{im}(P1)$ Hence the equality: $1/\{j\omega L+1/[Y_{antR}+j(Y_{antim}+j\omega C'_2)]\}+j\omega C'_1\omega=Y_r(P1)+Y_{im}(P1)$ If this equality is expanded to reveal the real and imaginary parts on the left-hand side, it remains only to equate the real part of the left-hand side with the real part of the right-hand side and the imaginary part of the left-hand side with the imaginary part of the right-hand side.

A system of two equations with two unknowns $C'_1$ and $C'_2$ is attained, which can easily be solved by calculation, with a single solution that is viable in practice.

$C'_1$ and $C'_2$ are hence calculated, which are the new values to be given to the capacitors $C_1$ and $C_2$ of the matching network MN to have perfect matching.

Recall at this stage that the calculated values $C'_1$ and $C'_2$ are normalized for a unit normalized nominal impedance and that if the desired nominal impedance is $Z_{opt}$, different from 1, it is of course necessary to multiply the results by $Z_{opt}$ to find the necessary real values for $C'_1$ and $C'_2$.

In the preceding calculations, it has been assumed that the output voltage V has been measured immediately at the output of the measurement amplifier to obtain the load impedance $Z=V/i$ with the aim of finding the values that make this impedance equal to the optimum impedance. It will be understood that it would have been possible to measure an output voltage from the amplifier V' downstream of the measurement impedance $Z_a$ ($C_a$) in order to determine a measured impedance $Z'=V'/i$ and to calculate the antenna impedance $Z_{ant}$ not as a function of Z but as a function of Z' by assuming that Z is quite simply equal to $Z'+Z_a$. The calculations based on Z' are thus directly deduced from the calculations based on Z. The impedance which must be made as close as possible to $Z_{opt}$ is of course the impedance $Z'+Z_a$.

It is understood that similar calculations can be done on the same principle with a matching network different from the network $C_1$, $C_2$, L in FIG. 2, and also with a impedance for measuring current different from the capacitor $C_a$.

From there, the calculation circuits (consisting in practice of a programmed microprocessor) provide control signals to a control circuit (CTRL in FIG. 1) which will give the capacitors $C_1$ and $C_2$ the desired new values $C'_1$ and $C'_2$.

Each capacitor may be organized in a network of capacitors, in series or in parallel, individually switchable by switching elements. The control circuit CTRL hence consists of these switching elements which adjust the overall capacitance by placing the appropriate number of elements in series and/or in parallel. The switching elements are controlled by the microprocessor.

It is also conceivable that the capacitor $C_1$ or the capacitor $C_2$ is a variable capacitor controllable by a voltage (a varactor diode for example) and in this case the numerical data defining the capacitor $C'_1$ or $C'_2$ is provided by the microprocessor and the control circuit then includes a digital-analogue converter that converts this data into an appropriate control voltage to control the variable capacitor so that this assumes the desired value.

The impedance matching may be carried out either a single time to calibrate the system, or several times, for example each time a signal transmission is carried out from the amplifier, or finally continuously: the calculation is systematically refreshed to check the matching and to correct it if necessary. This latter solution is advantageous as it enables matching to any change, but it has the drawback of consuming more energy.

If the matching is not recalculated continuously, it is possible to use some elements of the receiver, and especially the frequency transposition circuits, to carry out the conversion into the intermediate frequency necessary for the measurement of the voltages V and $v_a$.

To summarize the advantages of the invention, it can be said that:
  quick automatic impedance matching is available; there are
    not successive iterations, but a single overall calculation operation; the duration can therefore be reduced by a factor of 100 relative to the prior art;

the matching is accurate and mismatch losses can therefore be minimized, whence there is an improvement in the overall performance of the transmitter or of the receiver, whether this be in range, in sensitivity, or in the signal/noise ratio;

modules of the receiver can be used for the matching operation if this takes place in the transmission phase of the signal in a transmitter-receiver;

the integration is optimized in size due to the fact that it is not necessary to provide a bidirectional coupler; and with a measurement circuit implementing a frequency transposition, intermediate frequency filters contribute to minimizing the influence of parasitic interference that might superpose themselves on the measurement voltages V and $v_a$.

The invention will advantageously be implemented in on-board applications, where the computations will be made by microprocessors.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. Automatic impedance matching method for a radiofrequency transmission system comprising an amplifier, an antenna, and an impedance matching network between the amplifier and the antenna, the impedance matching network comprising several impedances, some of which have adjustable numerical values, and the radiofrequency transmission system having optimal desired performances when a nominal load impedance is connected at an output of the amplifier, the method comprising the steps of:

measuring current and voltage at the output of the amplifier;

calculating a complex impedance defined by the ratio between the voltage and the current, taking account of phase shift between the current and the voltage, the calculated complex impedance representing a present load impedance of the amplifier;

calculating an antenna impedance as a function of the present load impedance and as a function of the known present values of the adjustable impedances of the impedance matching network;

calculating, from the calculated antenna impedance, new values for the adjustable impedances of the impedance matching network that allow an overall load impedance of the amplifier to be obtained which is as close as possible to the nominal load impedance; and controlling the impedance matching network to adjust the adjustable impedances to the calculated new values.

2. Automatic impedance matching method for a radiofrequency reception system comprising at least an antenna, an amplifier, and an impedance matching network between the antenna and the amplifier, the impedance matching network comprising several impedances, some of which have adjustable numerical values, and the radiofrequency reception system having the desired performance when a nominal input impedance is connected at an input of the amplifier, the method comprising the steps:

measuring current and voltage at the input of the amplifier;

calculating a complex impedance defined by the ratio between the voltage and the current, taking account of phase shift between the voltage and the current, the calculated complex impedance representing an present input impedance presently connected to the amplifier;

calculating an antenna impedance as a function of the present input impedance and as a function of the known present values of the adjustable impedances of the impedance matching network;

calculating, from the calculated antenna impedance, new values for the adjustable impedances of the impedance matching network that allow an overall input impedance of the amplifier to be obtained which is as close as possible to the nominal input impedance; and controlling the impedance matching network to adjust the adjustable impedances to the calculated new values.

3. The automatic impedance matching method according to claim 1, wherein the current is measured by a measurement impedance (Za) of a known complex value inserted in series between the amplifier and the impedance matching network.

4. The automatic impedance matching method according to claim 1, including the working out of an electrical control voltage, depending on a new adjustable impedance value for the impedance matching network, and the application of the electrical control voltage to a variable capacitor which is controllable by the electrical control voltage and forms a part of the impedance matching network.

5. The automatic impedance matching method according to claim 1, including the working out of switching control signals from the result of the calculation of a new value of the adjustable impedances and the application of the switching control signals to a network of switchable elementary capacitors forming a part of the impedance matching network.

6. The automatic impedance matching method according to claim 3, including the working out of an electrical control voltage, depending on a new adjustable impedance value for the impedance matching network, and the application of the electrical control voltage to a variable capacitor which is controllable by the electrical control voltage and forms a part of the impedance matching network.

7. The automatic impedance matching method according to claim 3, including the working out of switching control signals from the result of the calculation of a new value of the adjustable impedances and the application of the switching control signals to a network of switchable elementary capacitors forming a part of the matching network.

8. Radiofrequency transmission or reception system comprising at least one amplifier having a nominal impedance, an antenna, and an impedance matching network between the at least one amplifier and the antenna, the impedance matching network comprising several impedances, some of which have adjustable numerical values, the system comprising:

a measurement impedance of a known complex value and inserted in series between the at least one amplifier and the impedance matching network;

means for measuring a first voltage, which is a voltage between terminals of the measurement impedance, and a second voltage, which is an output voltage of the at least one amplifier for the transmission system or an input voltage of the at least one amplifier for the reception system;

means for calculating a complex impedance defined by the ratio between the second voltage and the first voltage, taking account of the phase shift between the first and second voltages, the calculated complex impedance representing a present load or input impedance for the at least one amplifier;

means for calculating an antenna impedance as a function of the present load or input impedance and as a function of the known present values of the adjustable impedances of the impedance matching network;

means for calculating, from the calculated antenna impedance, new values for the adjustable impedances of the impedance matching network that allow an overall load or input impedance of the at least one amplifier to be obtained which is as close as possible to the nominal load or input impedance; and means for electrically controlling the impedance matching network to adjust the adjustable impedances to the calculated new values.

9. The radiofrequency transmission or reception system according to claim 8, wherein the measurement impedance is a capacitor.

10. The radiofrequency transmission or reception system according to claim 8, wherein the matching impedance network comprises a T or Pi assembly of three reactive elements.

11. The radiofrequency transmission or reception system according to claim 10, wherein the T or Pi assembly comprises two capacitors and one inductor or two inductors and one capacitor.

12. The radiofrequency transmission or reception system according to claim 11, wherein the matching impedance network comprises two adjustable capacitors.

13. The radiofrequency transmission or reception system according to claim 8, wherein the matching impedance network comprises a Pi assembly with two adjustable capacitors in parallel and an inductor in series between terminals of the two capacitors.

14. The radiofrequency transmission or reception system according to claim 8, wherein the matching impedance network comprises at least one variable capacitor having a network of switchable elementary capacitors to establish at will capacitance values that are selectively adjustable by an electrical control.

15. The radiofrequency transmission or reception system according to claim 8, wherein the matching impedance network comprises at least one variable capacitor that is controlled by an electric voltage.

16. The automatic impedance matching method according to claim 2, wherein the current is measured by a measurement impedance (Za) of a known complex value inserted in series between the amplifier and the impedance matching network.

17. The automatic impedance matching method according to claim 2, including the working out of an electrical control voltage, depending on a new adjustable impedance value for the impedance matching network, and the application of the electrical control voltage to a variable capacitor which is controllable by the electrical control voltage and forms a part of the matching network.

18. The automatic impedance matching method according to claim 2, including the working out of switching control signals from the result of the calculation of a new value of the adjustable impedances and the application of the switching control signals to a network of switchable elementary capacitors forming a part of the impedance matching network.

19. The radiofrequency transmission or reception system according to claim 9, wherein the impedance matching network comprises a T or Pi assembly of three reactive elements.

\* \* \* \* \*